United States Patent [19]

Gareis et al.

[11] Patent Number: 4,933,869
[45] Date of Patent: Jun. 12, 1990

[54] PROGRAMMABLE THRESHOLD DATA DETECTION SYSTEM

[76] Inventors: Ronald E. Gareis, 9 Salisbury Sq.; Mark J. Kocher, 2120 Wisteria Dr., both of Charlottesville, Va. 22901

[21] Appl. No.: 272,964

[22] Filed: Nov. 18, 1988

[51] Int. Cl.$^5$ .................. G06F 15/20; G06F 11/00
[52] U.S. Cl. ..................... 364/483; 364/173; 364/551.01; 364/582; 364/200; 328/135
[58] Field of Search ........... 364/483, 141, 173, 551.01, 364/582, 571.08, 900 MS File, 431.11, 200; 307/350, 351; 328/135, 262; 371/69.1

[56] References Cited

U.S. PATENT DOCUMENTS

| | | | |
|---|---|---|---|
| 3,513,400 | 5/1970 | Russell | 328/135 |
| 3,753,109 | 8/1973 | Schainbaum | 328/135 |
| 3,784,921 | 1/1974 | Iadipaolo | 328/135 |
| 4,476,706 | 10/1984 | Hadden et al. | 73/19 |
| 4,593,380 | 6/1986 | Kocher et al. | 364/900 |

Primary Examiner—Parshotam S. Lall
Assistant Examiner—Ellis B. Ramirez
Attorney, Agent, or Firm—Ormand R. Austin

[57] ABSTRACT

A threshold detection circuit is provided for determining when a data input signal exhibits an amplitude which exceeds a first programmable threshold level, is less than a second programmable threshold level or between the first and second levels. Respective scaling circuits scale down the data input signal and a line voltage signal which is supplied to the circuit to generate a scaled data input signal and a scaled line voltage signal. The threshold detection circuit scales the first and second threshold levels by a predetermined factor. The scaled data input signal is compared with the scaled first and second threshold levels. In response to this comparison, the output of the circuit assumes a first logic state when the data input signal exceeds the first threshold level and assumes a second logic state when the data input signal exhibits an amplitude less than the first threshold level. The comparison is repeated for the second threshold level. A control processor correlates the threshold level with the appropriate logic states to identify the data signal magnitude with respect to the threshold levels.

7 Claims, 2 Drawing Sheets

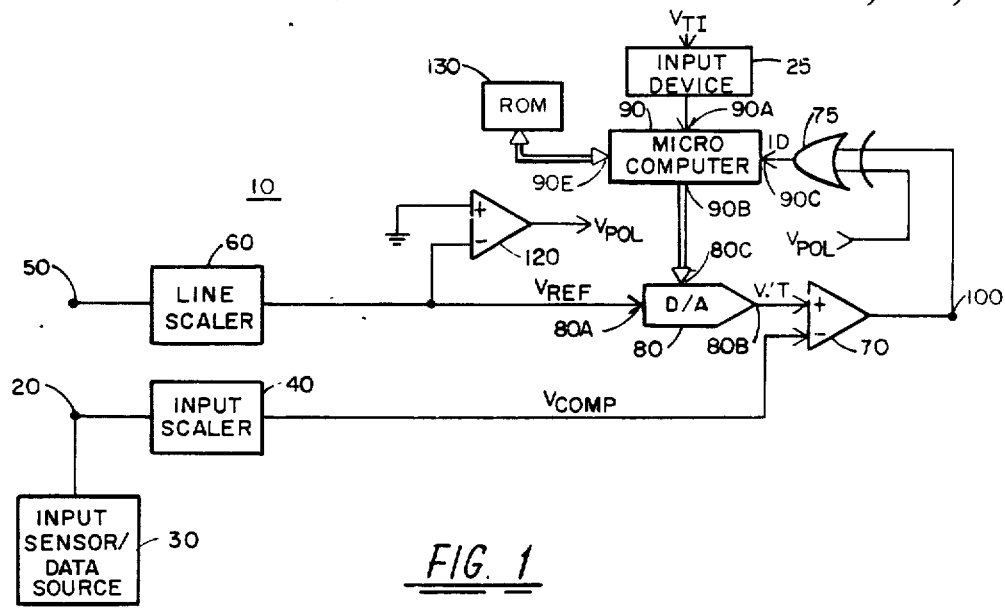
*FIG. 1*
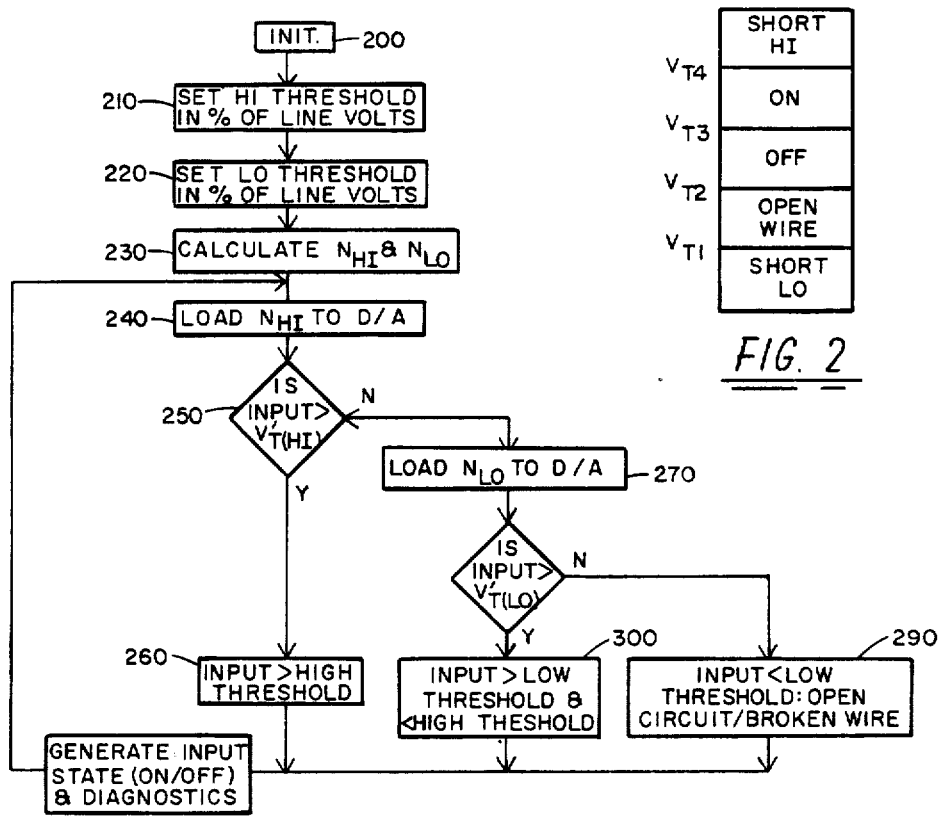
*FIG. 2*
*FIG. 5*

PROGRAMMABLE THRESHOLD DATA DETECTION SYSTEM

BACKGROUND OF THE INVENTION

This invention relates in general to a system for processing input data and, more particularly, to systems for determining the instantaneous relative magnitude of a data input signal with respect to selectable voltage threshold levels.

BRIEF SUMMARY OF THE INVENTION

In reading data from a data source such as a remote sensing device or other source, it is important not only to determine when a data signal exhibits an amplitude which is above or below a predetermined threshold level but also to determine whether the data read is valid. Furthermore, it is also desirable to be able to set threshold levels at different values in order to determine states of the input sensor or the validity of the received data.

One object of the present invention is to provide a system which exhibits programmable variable threshold levels which can be used to determine input state conditions including open and/or short circuit conditions of the remote sensing device.

Another object of the present invention is to provide a system which may be readily interfaced with a variety of input sensors or other sensors with different electrical characteristics.

In one embodiment of the invention, a threshold detection system is provided for detecting when a data input signal exhibits an instantaneous amplitude which exceeds a selected threshold level, such system being provided with a line voltage signal and the data input signal. The threshold detection system includes a programmable input circuit for permitting a user to select and input indicia of at least one of a plurality of voltage threshold levels to such system thus providing at least one selected threshold level. The threshold detection system further includes a comparator circuit for comparing indicia of the data input signal with indicia of the at least one selected threshold level to produce a first logic state when the amplitude of the data input signal exceeds the selected threshold level and to otherwise produce a logic state different from the first logic state.

In another embodiment of the invention, a threshold detection system is provided for detecting when the magnitude of a data input signal exceeds a first selectable threshold level, $V_{T(hi)}$, is less than a second selectable threshold level, $V_{T(lo)}$, or falls between the two threshold levels, such system being provided with a line voltage signal and the data input signal. The threshold detection system includes a first scaling circuit for scaling the data input signal by a first predetermined factor to generate a scaled data input signal. The threshold detection system further includes a second scaling means for scaling the line voltage signal by a second predetermined factor to generate a scaled reference signal. A voltage threshold input circit permits a user to indicate a selected high threshold voltage, $V_{T(hi)}$, and a selected low threshold voltage, $V_{T(lo)}$, to the detection circuit.

A multiplying circuit is incorporated in the system and connected for multiplying the scaled reference signal by third and fourth scale factors related to the $V_{T(hi)}$ and $V_{T(lo)}$ threshold voltages, respectively, to generate first and second scaled threshold voltage signals, $V'_{T(hi)}$ and $V'_{T(lo)}$, respectively. A comparator circuit is coupled to the multiplying circuit and the first input scaling circuit for generating a signal of first logical significance whenever the magnitude of the scaled data input signal exceeds the magnitude of the voltage threshold signals, $V'_{T(hi)}$ and $V'_{T(lo)}$, and for generating a signal of second logical significance otherwise. Processing means is provided for correlating the logical signals with the corresponding threshold value for establishing the relative magnitude of the input signal.

The features of the invention believed to be novel are specifically set forth in the appended claims. However, the invention itself, both as to its structure and method of operation, may best be understood by referring to the following description and the accompanying drawings.

BRIEF DESCRIPTION OF THE DRAWINGS

FIG. 1 is a simplified block diagram of one system incorporating the teachings of the present invention.

FIG. 2 is a graph illustrating the relationship of input sensor states with regard to voltage threshold levels.

FIG. 5 is a simplified flow chart for the sensor state evaluation performed by the system of FIG. 1.

DETAILED DESCRIPTION OF THE INVENTION

Figure 3:
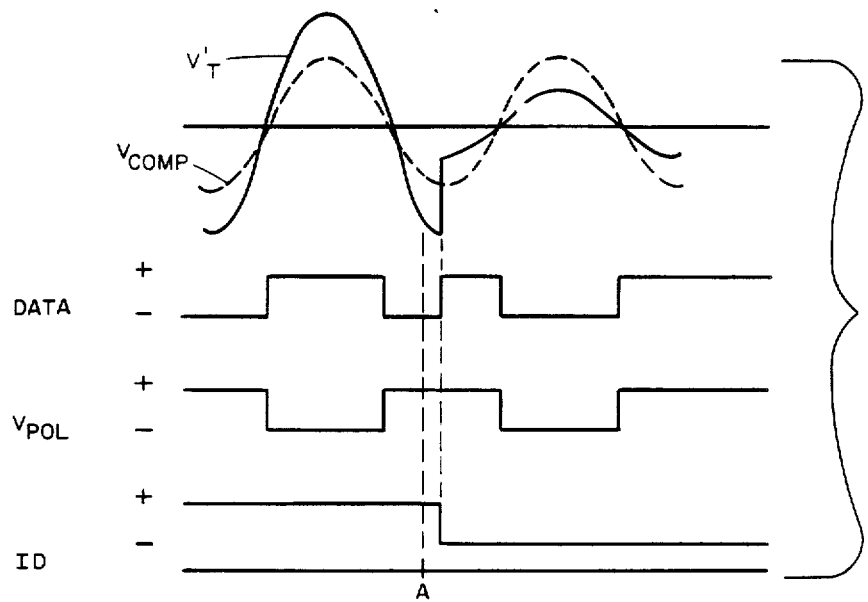
FIG. 3 illustrates selected waveforms appearing in the system of FIG. 1.

Turning now to FIG. 1, one embodiment of the programmable variable threshold data input system of the present invention is shown as system 10. System 10 is capable of determining the relative magnitude of a data input signal provided to a data input 20 with respect to a selected threshold value, $V_{Ti}$. For example, the system may be responsive to one or more threshold voltage settings or values, $V_{Ti}$, where i may be a value from 1 to at least 4. For purposes of explanation, two threshold values are described. For two thresholds, the system determines whether the magnitude of the input signal exceeds a selectable first threshold level $V_{T(hi)}$, is less than a selectable second threshold level $V_{T(lo)}$ or falls between the two thresholds. The first and second threshold levels are user selectable and are provided to system 10 via an input device 25 as will be described later in more detail. For the following description, only two threshold values $V_{T(hi)}$ and $V_{T(lo)}$ will be discussed. However, the system is not limited to only two values.

Data input 20 is coupled to a data source 30, for example a remote sensing device, which is the source of the aforementioned data input signal. Data input 20 is coupled to an input scaler circuit 40 such that the data input signal is scaled up or down by a fixed factor to voltage levels which are appropriate for processing by the remainder of system 10. For example, in one embodiment of the invention, when a data input signal with a voltage of 120 volts AC rms is provided to system 10, scaler circuit 40 scales the data input signal down by a factor of 0.045 to about 5.4 volts AC rms. Those skilled in the art will appreciate that other scale factors may be employed if desired depending on the level of the data input signal. The scaled data signal thus generated at the output of scaler circuit 40 is designated the $V_{comp}$ signal. The output terminal of data input scaler 40 which carries the $V_{comp}$ signal is coupled to an inverting input terminal of a comparator 70.

System 10 further includes a line voltage input 50 which is coupled to a source of line voltage (not shown) such that system 10 can monitor the amplitude of the line voltage supplied thereto, which voltage may also be supplied to sensor 30. Line voltage input 50 is coupled to a line scaler circuit 60 which scales down the line voltage signal by a fixed factor to a level which is appropriate for processing by the remainder of system 10. For example, in one embodiment of the invention wherein the line voltage supplied to line voltage input 50 is 120 volts AC rms, line scaler circuit 60 scales the line voltage signal down by a factor of approximately 0.045 to approximately 5.4 volts AC rms, the same as for the input data signal. The scaled line signal thus generated at the output of line scaling circuit 60 is designated the $V_{ref}$ signal.

The output terminal of line voltage scaler 60 which carries the $V_{ref}$ signal is coupled to a non-inverting input terminal of comparator 70 via a multiplying digital to analog (D/A) converter 80. D/A converter 80 includes a reference signal input terminal 80A and an output terminal 80B at which a threshold voltage, $V'_T$, is generated, $V'_T$ will take on values of $V'_{T(hi)}$ and $V'_{T(lo)}$ depending on the input values of thresholds $V_{T(hi)}$ and $V_{T(lo)}$, respectively, provided to input device 25, as will be discussed later.

D/A converter 80 further includes a buss input terminal 80C at which a digital equivalent of a number N (that is, $N_{hi}$ or $N_{lo}$) is provided by a microprocessor 90. More specifically, in response to the particular values of thresholds $V_{T(hi)}$ and $V_{T(lo)}$ which are input to microprocessor 90 via input device 25, corresponding values of $N_{hi}$ and $N_{lo}$ are provided to buss input terminal 80C by microprocessor 90. Microprocessor 90 generates a value of $N_{hi}$ for each $V_{hi}$ input threshold value and a value of $N_{lo}$ for each $V_{lo}$ input threshold value. In general, $N = - - - \times 256$, where $V_{TH}$ is the selected threshold voltage and $V_{LINE}$ is line voltage at terminal 50 and it is assumed that the scale factors for scalers 40 and 60 are equal. The value "256" is a digital scale factor for an 8-bit system. N thus becomes a percent multiplier for converting the $V_{ref}$ signal to a value corresponding to $V_{TH}$. Microprocessor 90 controls and oversees the operation of system 10. One microprocessor which may be employed as microprocessor 90 is the Model No. 6303 microprocessor manufactured by Hitachi, Ltd. Microprocessor 90 includes an input port 90A which is coupled to input device 25 to permit a user to instruct or program system 10 as to the particular threshold voltage levels $V_{T(hi)}$ and $V_{T(lo)}$ against which the data input signal is to be tested. For example, one user programming interface which may be used as input device 25 is the Genius Hand Held Monitor, manufactured by GE Fanuc Automation, N.A. $V_{T(hi)}$ and $V_{T(lo)}$ may have values anywhere between 0 volts and the full line voltage.

Multiplying D/A converter 80 multiplies the $V_{ref}$ signal from line scaler 60 by a fractional value less than one which is determined by the particular value of N (that is, $N_{hi}$ or $N_{lo}$) provided to converter 80 by microprocessor 80. The result is provided at output 80B. For example, if D/A converter 80 has an 8 bit buss input 80C, then $V'_T = V_{ref} \times (N/2^8)$, or $V'_T = V_{ref} \times (N/256)$. Here, the quantity (N/256) is designated the fractional multiplier.

From the above it is seen that the value selected for N determines the value of $V'_T$ which is the threshold level provided to comparator 70. To determine if the data input signal exceeds the $V_{T(hi)}$ threshold, microprocessor 90 outputs a corresponding $N_{hi}$ value (from a "look-up" table or N calculation) at output port 90B. D/A converter 80 then multiplies the $V_{ref}$ signal by a fractional multiplier related to $N_{hi}$ as described above to generate the programmable $V'_{T(hi)}$ threshold signal at D/A output 80B. Comparator 70 then compares the $V_{comp}$ signal with the threshold level signal, $V'_T$, which is now programmed or set to $V'_{T(hi)}$. When the instantaneous value of the $V_{comp}$ signal provided to the inverting input of comparator 70 exceeds the $V'_T$ signal provided to the non-inverting input of comparator 70, then comparator 70 generates or assumes a first logic state (for example, a logical 1) at output 100 to indicate that the data input signal has reached and exceeded the selected VT(hi) threshold level.

System 10 then acts to determine when the instantaneous value of the data input signal falls below the $V_{T(lo)}$ threshold provided to input device 25. To accomplish this, microprocessor 90 determines the $N_{lo}$ value corresponding to the $V_{T(lo)}$ threshold provided at input device 25 and provides that $N_{lo}$ value to D/A converter 80. D/A converter 80 then multiplies the $V_{ref}$ signal by a fractional multiplier related to $N_{lo}$ as already described above to generate the $V'_{T(lo)}$ threshold signal. Thus, when the instantaneous value of the $V_{comp}$ signal provided to the inverting input of comparator 70 is less than the $V'_{T(lo)}$ signal provided to the non-inverting input of comparator 70, then comparator 70 generates or assumes a second logic state (for example, a logical 0) at output 100 to indicate that the data input signal has assumed a value less than the selected $V_{T(lo)}$ threshold level.

It is noted that system 10 as described above involves multiple threshold levels, that is, $V_{T(hi)}$ and $V_{T(lo)}$. At the user's option, the user can program system 10 such that $V_{T(hi)} = V_{T(lo)}$ by providing the same numerical values for $V_{T(hi)}$ and $V_{T(lo)}$ to input device 25. In this instance, system 10 will check to determine whether the data input signal is greater or less than a single threshold level. The user may also elect to enter a single threshold $V_T$ or enter multiple thresholds. As will become apparent by reference to FIG. 2, four thresholds can be utilized to distinguish between a shorted condition to the high side of the power source (Short-Hi), whether the input data source is ON or OFF, whether there exists an OPEN-WIRE condition or whether a shorted condition to ground exists (Short-Lo). The various threshold values required to determine the above conditions can be established by analysis of the circuit characteristics. It will be appreciated that for each threshold comparison, the processor 90 first provides a reference value and thereafter "reads" the result of the comparison.

The data output of comparator 70 is coupled to a first input terminal of an exclusive OR circuit 75. A second input terminal of circuit 75 is connected to receive a signal $V_{pol}$ (voltage polarity) from a comparator 120. The logical sense of the data output (DATA) signal from comparator 70 at data output 100 is dependent on the polarity of the line voltage at line voltage input 50. To account for the instantaneous polarity of the data input signal at terminal 20, the polarity signal $V_{pol}$ is obtained by comparing the line voltage to common with the comparator 120. More particularly, the inverting input of comparator 120 is coupled to the output of line voltage scaler 60. The non-inverting input of comparator 120 is coupled to common circuit. The output signal of comparator 120 is the $V_{pol}$ signal, the state of which indicates the polarity of the line voltage signal. The output of comparator 120 is coupled to an input terminal of the exclusive OR circuit 75. The $V_{pol}$ signal is a digital two-state signal. The state of the data input at terminal 20 is determined by implementing an exclusive OR test to determine if the DATA signal is in phase or out of phase with $V_{pol}$. This can be seen more clearly in FIG. 3 in which the waveforms associated with $V_{ref}$, $V_{comp}$, Data and $V_{pol}$ are shown. Note that the DATA signal toggles between high and low values depending upon the relative values of $V_{ref}$ and $V_{comp}$. If the DATA signal has the same state as $V_{pol}$, the signals are in phase.

Figure 4:
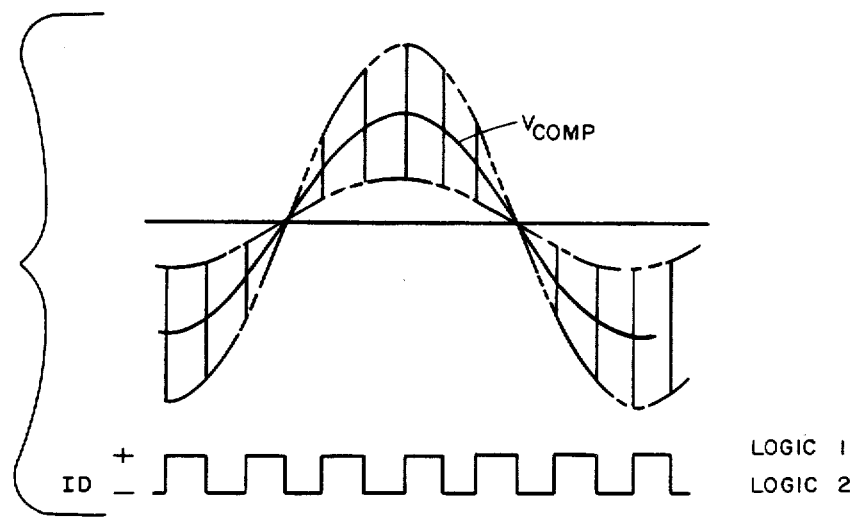
FIG. 4 illustrates selected waveforms in one modification of FIG. 1.

The output signal developed by exclusive OR gate 75 is labeled ID for "input data" to processor 90. By reference to FIG. 3, it can be seen that the effect of gate 75 is to convert the DATA signal at terminal 100 to a signal indicative of the relative magnitude of $V_{comp}$ and $V'_T$ without regard to polarity. Note, for example, point A on FIG. 3 where $V'_T$ is more negative than $V_{comp}$, i.e., has a higher magnitude. The DATA signal is inverted because of the negative polarity but the ID signal remains at a logic 1 level thus compensating for the polarity changes. A logic 1 ID signal indicates that the magnitude of the $V'_T$ threshold signal is greater than that of the $V_{comp}$ signal while a logic 0 ID signal indicates that the magnitude of the $V'_T$ threshold signal is less than that of the $V_{comp}$ signal. FIG. 4 illustrates this same function for a system in which threshold levels are switched several times in each half cycle of the AC input data waveform. Note that the logical state of the ID signal tracks the relative magnitude of the input signal with respect to the thresholds.

The actual program code which controls the operation of microprocessor 90 is stored in a read only memory (ROM) 130 which is coupled to input port 90E of microprocessor 90. FIG. 5 is a flowchart of the program employed to control the operation of microprocessor 90 of the programmable threshold data detection circuit of the present invention. The circuit is initialized or powered up at block 200. The user then inputs a first high threshold, $V_{T(hi)}$, to system 10 via input device 25 at block 210. If desired, at block 220 the user then inputs a second low threshold voltage, $V_{T(lo)}$, which is a lower voltage than the first high threshold voltage, $V_{T(hi)}$. From FIG. 3 it will be appreciated that system 10 generates a logical 1 for data input values at terminal 20 less than the magnitude of either threshold value, and a logical 0 for data input values which are greater than either threshold value.

After the threshold input information referred to above is provided to microprocessor 90, microprocessor 90 calculates the $N_{hi}$, $N_{lo}$ values which correspond to the $V_{T(hi)}$, $V_{T(lo)}$ thresholds as per block 230.

At block 240 the $N_{hi}$ value corresponding to $V_{T(hi)}$ is loaded into D/A converter 80 which multiplies the $V_{ref}$ value supplied to D/A converter 80 by the fractional multiplier corresponding to the current $N_{hi}$ value thus generating the first high threshold voltage $V'_{T(hi)}$ employed by comparator 70. The results of the comparison of $V'_T$ and $V_{comp}$ sets the output state of exclusive OR gate 75, which state is detected by processor 90. If the output state is a logic 0 indicating $V_{comp}$ greater than $V'_{T(hi)}$, block 250, the processor program indicates an "ON" state, block 260, for this simple two threshold case. If $V_{comp}$ is less than $V'_{T(hi)}$, it is necessary to compare $V_{comp}$ to the low threshold $V'_{T(lo)}$ to determine whether the source 30 is OFF or an open wire exists. The program will therefore load the low threshold value $N_{lo}$ to D/A 80, block 270. The result of the comparison of $V'_{T(lo)}$ to $V_{comp}$, block 280, yields either an error signal, block 290, or an OFF signal, block 300. Each of the signals from program blocks 260, 290 and 300 effect further program operation by generating appropriate status conditions, block 310, e.g., input state ON/OFF or open wire. Compare the flow chart of FIG. 5 with the status conditions indicated by FIG. 2. Diagnostics may involve introduction of different threshold values to D/A 80 in order to more precisely fix the magnitude of the $V_{comp}$ signal. For example, two further thresholds, one high and one low can be used to identify a high short circuit or a low short circuit as shown in FIG. 2. Thus, from block 310 the program branches back to the step of loading N values to D/A 80. New threshold values may be available at this branching based upon the results at block 310 and the desired capability of the system. Note that for the simplest ON/OFF indication, only a single threshold is required and the steps indicated in blocks 260–300 can be deleted.

From the above description, it is clear that the invention involves a method and apparatus for detecting when the magnitude of a data input signal exceeds a predetermined threshold level, $V_T$, comprising the steps of providing an input for a line voltage signal and providing an input for a data input signal. The method further includes the steps of scaling the line voltage signal by a first predetermined factor to generate a scaled reference signal and scaling the data input signal by a second predetermined factor to generate a scaled data input signal. The method continues with the step of programmably selecting the threshold level, $V_T$, thus providing a selected threshold level. The scaled reference signal is multiplied by a selected scale factor related to the selected threshold level to generate a voltage threshold level signal, $V'_T$. The method includes the step of comparing the scaled data input signal with the voltage threshold level signal and generating a first logic state (for example, a logical 1) whenever the scaled data input signal exceeds the voltage threshold signal and generating a second logic state (for example, a logical 0) when the data input signal is less than the voltage threshold signal. Finally, the method includes compensating for instantaneous polarity changes to force a magnitude comparison only. The steps of the method may be carried out repetitively and not necessarily in the particular order given above and may include other than the single threshold value illustrated.

The foregoing has described an apparatus and method for providing detection of when a data signal is greater than a high selected threshold or less than a low selected threshold or between the selected thresholds.

While only certain preferred features of the invention have been shown by way of illustration, many modifications and changes will occur to those skilled in the art. It is, therefore, to be understood that the present claims are intended to cover all such modifications and changes which fall within the true spirit of the invention.

We claim:

1. A method for determining the instantaneous state of a remote input sensor connected to an input point of a microprocessor based controller, the sensor providing an input point signal having a value indicative of one at least two operating states and a failure state, the sensor being powered by line voltage from a voltage source, the controller including means for selecting at least first and second voltage threshold values indicative of the states of the input sensor, the method comprising the steps of:

(a) establishing a scaled value of the line voltage suitable for application to a digital logic circuit;

(b) scaling the input point signal by a factor predeterminately correlated to a scaling value used to scale the line voltage;

(c) selecting at least first and second threshold values for comparison to the scaled input point signal;

(d) converting the first and second threshold values to corresponding first and second ratios threshold value to line voltage;

(e) multiplying the scaled line voltage by the first ratio to obtain a first scaled threshold value;

(f) comparing the first scaled threshold value to the scaled input point signal to obtain a first signal set comprising a signal of first logical significance when the first scaled threshold value is less than the scaled input point signal and a signal of a second logical significance otherwise;

(g) repeating steps (e) through step (f) for the second threshold value to obtain a second signal set comprising a signal of first logical significance when the second scaled threshold value is less than the scaled input point signal and a signal of second logical significance otherwise; and (h) evaluating the two sets of signals of first and second logical significance for defining the at least two operating states of the input sensor and the failure state thereof.

2. The method of claim 1 wherein the step of selecting at least a first and a second threshold value includes the steps of selecting additional threshold values and the steps (d) through (f) are repeated for each of the additional threshold values, the obtained logical signals being correlated with the corresponding threshold values for identifying additional states of the input sensor.

3. A method for detecting when a data input signal exceeds a first threshold level, $V_{T(hi)}$, is less than a second threshold level, $V_{T(lo)}$, or between the $V_{T(hi)}$ and $V_{T(lo)}$ threshold levels comprising the steps of:

(a) providing a line voltage signal representative of line voltage;

(b) providing a data input signal;

(c) scaling said line voltage signal by a first predetermined factor to generate a scaled reference signal;

(d) scaling said data input signal by a second predetermined factor to generate a scaled data input signal;

(e) selecting a first threshold level, $V_{T(hi)}$, and a second threshold level, $V_{T(lo)}$;

(f) multiplying sequentially said scaled reference signal by first and second scale factors corresponding, respectively, to said first threshold level, $V_{T(hi)}$, and said second threshold level, $V_{T(lo)}$, for generating first and second scaled voltage threshold level signals, $V'_{T(hi)}$ and $V'_{T(lo)}$, respectively;

(g) comparing said scaled data input signal with each of said first and second voltage threshold level signals for generating first and second logical state signals indicative, respectively, of the magnitude of said scaled data input signal with respect to a corresponding one of said voltage threshold signals; and (h) correlating said first and second logical state signals with the occurrence of said sequential first and second scale factors for determining the magnitude of said data input signal with respect to said threshold voltages.

4. A system for detecting when a data input signal exceeds a first selectable threshold level, $V_{T(hi)}$, is less than a second selectable threshold level, $V_{T(lo)}$, or is between $V_{T(hi)}$ and $V_{T(lo)}$, said system being provided with a line voltage signal and said date input signal, said system comprising:

(a) first scaling means for scaling said data input signal by a first predetermined factor to generate a scaled data input signal;

(b) second scaling means for scaling said line voltage signal by a second predetermined factor to generate a scaled reference signal;

(c) voltage threshold input means for selecting a high threshold voltage, $V_{T(hi)}$, and a low threshold voltage, $V_{T(lo)}$;

(d) multiplying means, coupled to said input means and said second scaling means for multiplying said scaled reference signal by third and fourth scale factors corresponding to said $V_{T(hi)}$ and $V_{T(lo)}$ threshold voltages, respectively, to generate first and second scaled threshold voltage signals, $V'_{T(hi)}$ and $V'_{T(lo)}$, respectively;

(e) means coupled to said scaling and to said multiplying means for providing a first logical state signal when the magnitude of said scaled data input signal exceeds the magnitude of said $V'_{T(hi)}$ and said $V'_{T(lo)}$ threshold signals and for providing a second logical state signal when the magnitude of said scaled data input signal is less than the magnitude of said $V'_{T(hi)}$ and $V'_{T(lo)}$ threshold signals; and (f) processing means for correlating said first and second logical state signals with the occurrence of said high and low threshold voltages for determining the relative value of said data input signal with respect to said threshold voltages.

5. The system of claim 4 wherein said providing means comprises:

(a) means for generating signals of first and second logical significance indicative, respectively, of the positive and negative polarity of said line voltage signal with respect to system common;

(b) means for comparing each of said voltage threshold signals $V'_{T(hi)}$ and $V'_{T(lo)}$ to said scaled input signal and for generating signals of first and second logical significance indicative, respectively, of whether the signed amplitude of said sealed input signal is greater or less than the signed amplitude of the compared one of the voltage threshold signals; and (c) means responsive to said signals of first and second logical significance indicative of the polarity of said line voltage signal for converting said signals from said comparing means to said first and second logical state signals indicative of the relative magnitude of said scaled data input signal with respect to said threshold signals.

6. The system of claim 5 wherein said converting means comprises an exclusive OR circit having a first input terminal connected for receiving said polarity indicative signals from said generating means and having a second input terminal connected for receiving said amplitude indicative signals from said comparing means.

7. The system of claim 4 wherein said multiplying means comprises a multiplying digital-to-analog (D/A) converter, said third and fourth scale factors being digital signals computed from the ratio $V_{TH}/V_L * 2^M$, where $V_{TH}$ is the selected threshold voltage, $V_L$ is the line voltage and M is a value corresponding to the number of bits to be used in the scale factors.

* * * * *

UNITED STATES PATENT AND TRADEMARK OFFICE
CERTIFICATE OF CORRECTION

PATENT NO. : 4933869

DATED : 06/12/90

INVENTOR(S) : Ronald E. Gareis and Mark J. Kocher

It is certified that error appears in the above-identified patent and that said Letters Patent is hereby corrected as shown below:

ON TITLE PAGE: Item [73]

Assigned to GE Fanuc Automation North America, Inc., Charlottesville, Virginia

Signed and Sealed this

Twelfth Day of May, 1992

Attest:

DOUGLAS B. COMER

Attesting Officer

Acting Commissioner of Patents and Trademarks